(12) United States Patent
Kwon et al.

(10) Patent No.: US 12,144,146 B2
(45) Date of Patent: Nov. 12, 2024

(54) COOLING APPARATUS FOR POWER MODULE

(71) Applicants: Hyundai Motor Company, Seoul (KR); Kia Corporation, Seoul (KR)

(72) Inventors: Se Heun Kwon, Incheon (KR); Hyong Joon Park, Hwaseong-Si (KR); Sang Hun Lee, Taebaek-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 214 days.

(21) Appl. No.: 17/981,276

(22) Filed: Nov. 4, 2022

(65) Prior Publication Data
US 2023/0413478 A1    Dec. 21, 2023

(30) Foreign Application Priority Data
Jun. 9, 2022   (KR) .................. 10-2022-0070038

(51) Int. Cl.
*H05K 7/20* (2006.01)

(52) U.S. Cl.
CPC ..... *H05K 7/20272* (2013.01); *H05K 7/20927* (2013.01)

(58) Field of Classification Search
CPC .......... H05K 7/20927; H05K 7/20254; H05K 7/20272; H05K 7/20872; H05K 7/209; H05K 5/0021; H05K 7/20218; H05K 7/2089; H05K 7/20863; H05K 7/20509; H01L 23/473; H01L 23/4735; H01L 2924/1305; H01L 2924/13055; H01L 23/3107; H01L 23/4012; F28F 3/12; F28F 2255/14; F28F 1/00; F28F 3/02; F28F 9/0278; F28F 9/0268
See application file for complete search history.

(56) References Cited

U.S. PATENT DOCUMENTS

| | | | |
|---|---|---|---|
| 6,257,320 B1 | 7/2001 | Wargo | |
| 8,482,919 B2 | 7/2013 | Dede | |
| 10,601,054 B2 | 3/2020 | Zare et al. | |
| 11,428,478 B2 * | 8/2022 | Zhou | H05K 7/20927 |

(Continued)

FOREIGN PATENT DOCUMENTS

| | | |
|---|---|---|
| JP | 3473784 | 12/2003 |
| KR | 10-2002-0020881 | 3/2002 |

(Continued)

OTHER PUBLICATIONS

Samantha Jones-Jackson, et al. (2021). Jet Impingement Cooling in Power Electronics for Electrified Automotive Transportation: Current Status and Future Trends. IEEE. 36(9): 10420-10435.

(Continued)

*Primary Examiner* — Mandeep S Buttar
(74) *Attorney, Agent, or Firm* — Morgan, Lewis & Bockius LLP

(57) ABSTRACT

A cooling apparatus of a power module includes a guide provided inside a manifold cover to control a flow of a cooling fluid, wherein the cooling fluid circulated inside the manifold cover forms a vertical turbulent flow by the guide so that cooling efficiency of the power module is secured only using an internal structure of the manifold cover. Thus, heat dissipation performance is improved without a separate fin plate or a separate nozzle injection device.

13 Claims, 8 Drawing Sheets

(56) References Cited

U.S. PATENT DOCUMENTS

| | | | |
|---|---|---|---|
| 2007/0119574 A1* | 5/2007 | Olesen | F28F 3/12 |
| | | | 257/E23.098 |
| 2007/0188991 A1* | 8/2007 | Wilson | H01L 23/473 |
| | | | 361/689 |
| 2012/0063091 A1 | 3/2012 | Dede et al. | |
| 2013/0220587 A1* | 8/2013 | Tamura | F28F 3/022 |
| | | | 165/185 |
| 2014/0190668 A1 | 7/2014 | Joshi et al. | |
| 2017/0055378 A1 | 2/2017 | Zhou et al. | |
| 2019/0181717 A1* | 6/2019 | Zhou | H02K 11/33 |
| 2019/0335628 A1* | 10/2019 | Lei | H05K 7/20872 |
| 2022/0142013 A1* | 5/2022 | Zhou | F28F 3/12 |
| | | | 361/702 |
| 2023/0317559 A1* | 10/2023 | Wang | H01L 23/427 |
| | | | 257/715 |

FOREIGN PATENT DOCUMENTS

| | | |
|---|---|---|
| KR | 10-2014-0084590 | 7/2014 |
| KR | 10-2023-0094013 | 6/2023 |

OTHER PUBLICATIONS

Avijit Bhunia, et al. (2007). Performance Improvement of a Power Conversion Module by Liquid Micro-Jet Impingement Cooling. IEEE. 30(2): 309-316.

MD Lokman Hosain, et al. (2014). Multi-Jet Impingement Cooling of a Hot Flat Steel Plate. Energy Procedia. 61: 1835-1839.

* cited by examiner

COOLING APPARATUS FOR POWER MODULE

CROSS REFERENCE TO RELATED APPLICATION

The present application claims priority to Korean Patent Application No. 10-2022-0070038 filed on Jun. 9, 2022, the entire contents of which is incorporated herein for all purposes by this reference.

BACKGROUND OF THE PRESENT DISCLOSURE

Field of the Present Disclosure

The present disclosure relates to a cooling apparatus for a power module, which cools a power module using a cooling fluid.

Description of Related Art

Power modules are applied to electric vehicles and the like to control high voltages and large currents. Accordingly, the amount of heat generated is very large, and thus proper cooling is required to maintain performance and durability. To this end, the power module is cooled using a cooling fluid.

According to the related art, it is general to connect a cooling apparatus to one side surface of a power module to cool the power module and circulate a cooling fluid to the cooling apparatus. However, in the conventional cooling apparatus, there is a problem in that a simplified structure or a fin structure, which is generally used, is applied so that cooling efficiency is not high.

Because cooling efficiency of an electric vehicle or the like is closely related to the overall energy efficiency of the electric vehicle, and affects a great influence on durability and performance maintenance of the power module, it is necessary to increase cooling efficiency of a power module through a new cooling structure.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a cooling apparatus of a power module, in which a guide is provided inside a manifold cover to control a flow of a cooling fluid, and the cooling fluid circulated inside the manifold cover forms a vertical turbulent flow by the guide so that cooling efficiency of the power module is secured only using an internal structure of the manifold cover.

According to one aspect, there is provided a cooling apparatus of a power module, which includes a manifold cover to which the power module is coupled and in which an inlet and an outlet through which a cooling fluid flows are formed, and a guide which is provided inside the manifold cover to be in contact with the power module, wherein a plurality of first channels opened toward the inlet of the manifold cover and a plurality of second channels opened toward the outlet of the manifold cover are formed, and in which a plurality of micro-flow paths for fluidically communicating the first channels with the second channels are formed.

The cooling apparatus may further include a gasket located between the manifold cover and the power module.

The guide may include a plurality of walls extending to partition the first channels and the second channels in the guide, first blocking portions connected to two walls among the plurality of walls to block the outlet in the first channels, and a second blocking portion connected to two walls among the plurality of the walls to block the inlet in the second channel.

In the guide, the first blocking portion and the second blocking portion which connect the plurality of walls may be formed so that the first channel and the second channel may be alternately disposed.

In the guide, the second channel may be located to face the inlet of the manifold cover so that the second blocking portion may face the inlet, and the first channel and the second channel may be alternately disposed on both sides of the second channel disposed to face the inlet.

The inlet and the outlet of the manifold cover may be disposed on a straight line, and the guide may be formed so that the first channel and the second channel extend in a straight line along the inlet and the outlet, and the micro-flow paths intersect perpendicular to an extension direction of the first channel and the second channel.

The micro-flow path of the guide may be formed to have a cross section of a curved shape including a polygonal or semicircular shape.

The manifold cover and the guide may each be made of a thermoplastic elastomer (TPE) material.

A molding portion made of an epoxy material may be provided in the power module, and an edge portion of the manifold cover, which is adhered to the power module, may be directly adhered to the power module.

The manifold cover may be manufactured to include the guide through injection molding, and the manifold cover may be bonded and adhered to the molding portion of the power module.

The manifold cover may be provided as a plurality of manifold covers, and the manifold covers may be disposed on both sides of the power module so that the power module may exchange heat with the cooling fluid through the plurality of manifold covers.

When the manifold cover is provided as a plurality of manifold covers and each manifold cover is disposed in series, the inlet and the outlet of each manifold cover may be connected to those of another manifold cover so that the cooling fluid may be shared.

When the manifold cover is provided as a plurality of manifold covers and each manifold cover is disposed in parallel, the inlet and the outlet of each manifold cover may be connected to those of another manifold cover through a connection passage so that the cooling fluid may be shared.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
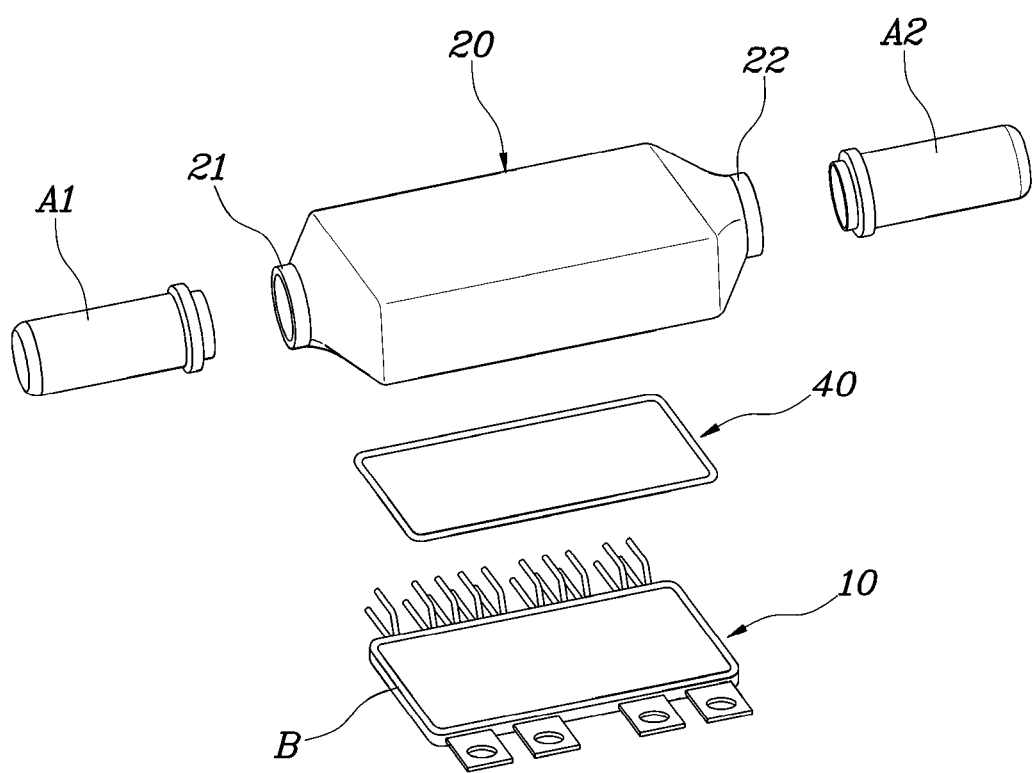
FIG. 1 is a diagram illustrating a cooling apparatus of a power module according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, embodiments included in the present specification will be described in detail with reference to the drawings. The same reference numerals are provided to the same or similar components regardless of reference numerals, and a repetitive description thereof will be omitted.

As used herein, suffixes "module" and "portion" for a component of the present disclosure are used or interchangeably used solely for ease of preparation of the specification, and do not have different meanings and each thereof does not function by itself.

In the following description of the present specification, when a detailed description of a known related art is determined to obscure the gist of the present specification, the detailed description thereof will be omitted herein.

Furthermore, the accompanying drawings are merely for easy understanding of the exemplary embodiments included in the present specification, the technical spirit included in the present specification is not limited by the accompanying drawings, and it may be understood to include all modifications, equivalents, and substitutes included in the spirit and scope of the present disclosure.

Terms including ordinal numbers such as first, second, and the like used herein may be used to describe various components, but the various components are not limited by these terms. The terms are used only for distinguishing one component from another component.

When a component is referred to as being "connected" or "coupled" to another component, the component may be directly connected or coupled to another component, but it should be understood that sill another component may be present between the component and another component. On the other hand, when a component is referred to as being "directly connected" or "directly coupled" to another, it should be understood that yet another component may not be present between the component and another component.

Unless the context clearly dictates otherwise, the singular form includes the plural form.

In the present disclosure, the terms "comprising," "having," or the like are used to specify that a feature, a number, a step, an operation, a component, an element, or a combination thereof described herein exists, and they do not preclude the presence or addition of one or more other features, numbers, steps, operations, components, elements, or combinations thereof.

Figure 2:
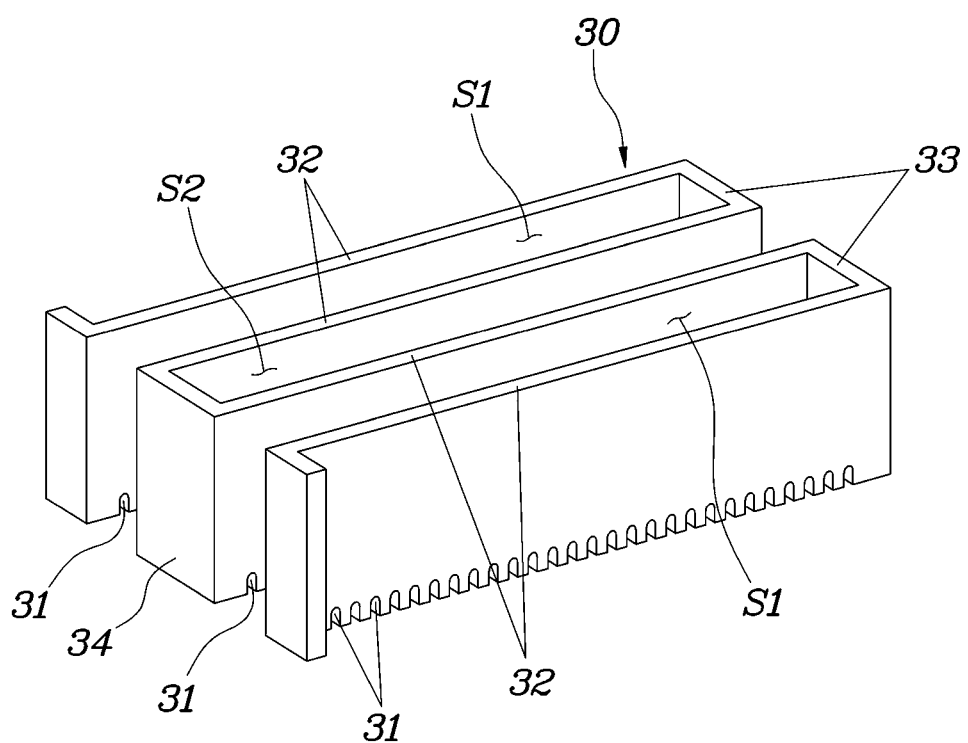
FIG. 2 is a diagram illustrating a guide of the cooling apparatus of a power module shown in FIG. 1.
Figure 3:
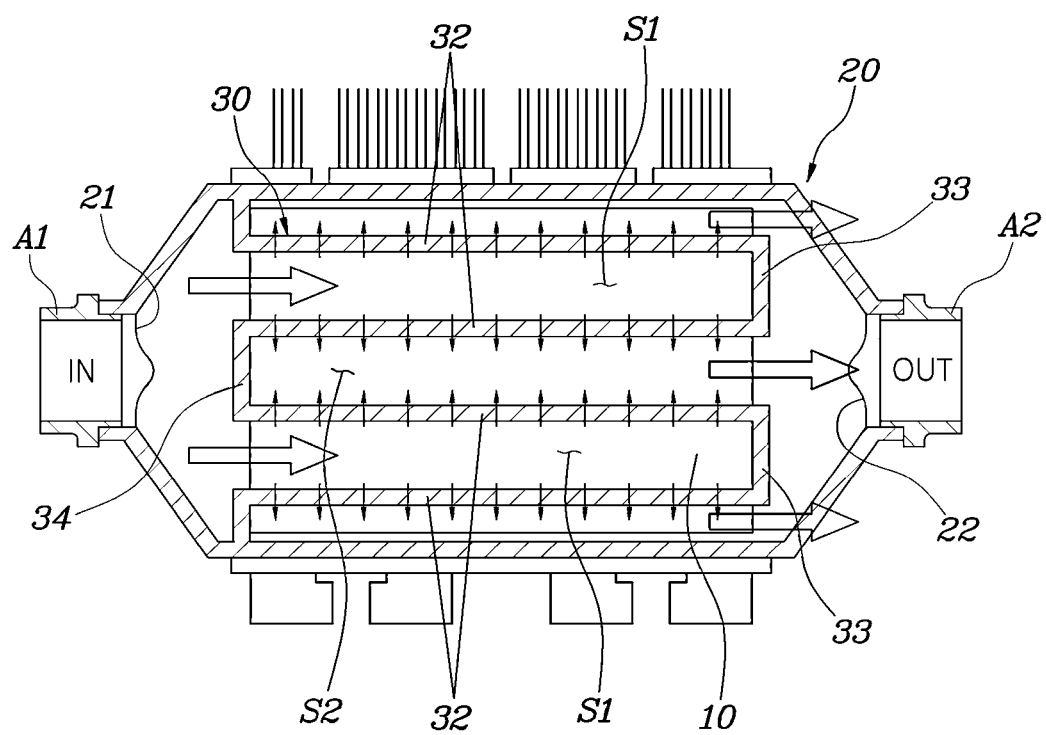
FIG. 3 is a diagram illustrating a first channel and a second channel of the cooling apparatus of a power module shown in FIG. 1.
Figure 4:
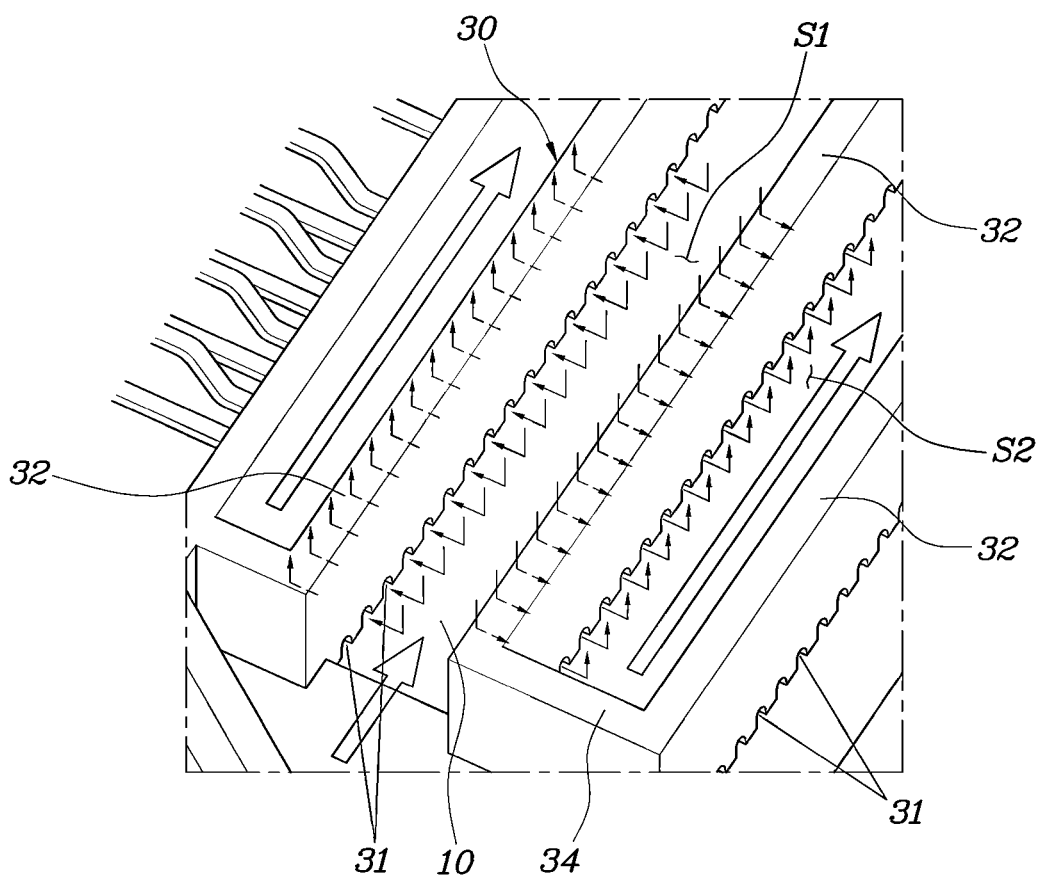
FIG. 4 is a diagram illustrating a flow of a cooling fluid flow in the cooling apparatus of a power module shown in FIG. 1.
Figure 5:
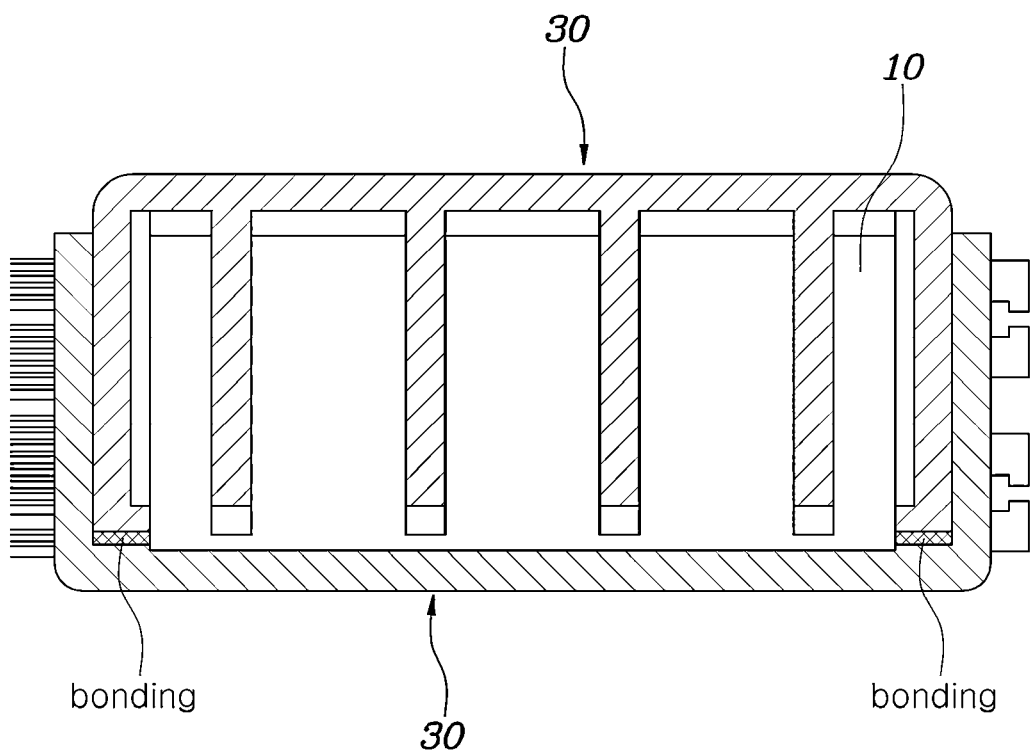
FIG. 5 is a diagram illustrating a connection between a manifold cover and the guide of the cooling apparatus of a power module shown in FIG. 1.
Figure 6:
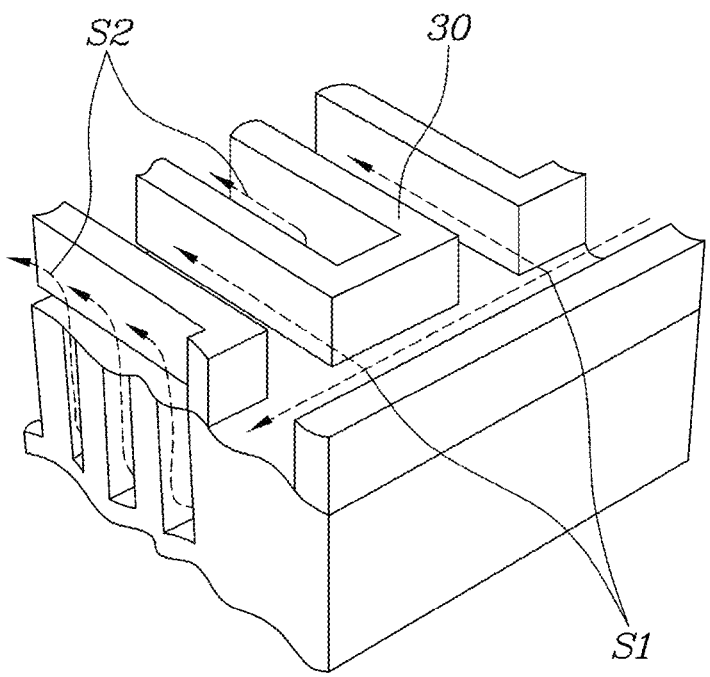
FIG. 6 is a diagram illustrating micro-channels of the cooling device for a power module shown in FIG. 1.
Figure 7:
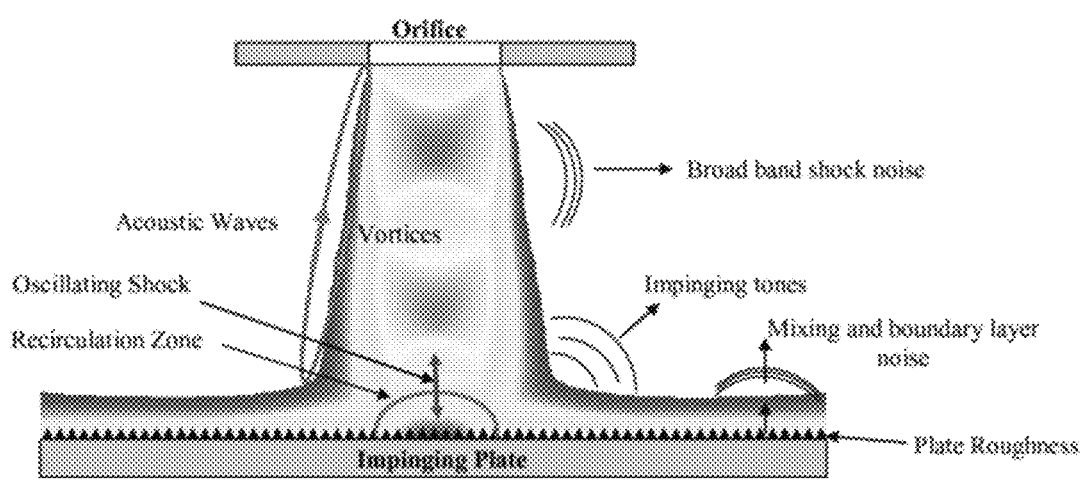
FIG. 7 is a diagram illustrating a thermal analysis simulation result of the cooling apparatus of a power module shown in FIG. 1.
Figure 8:
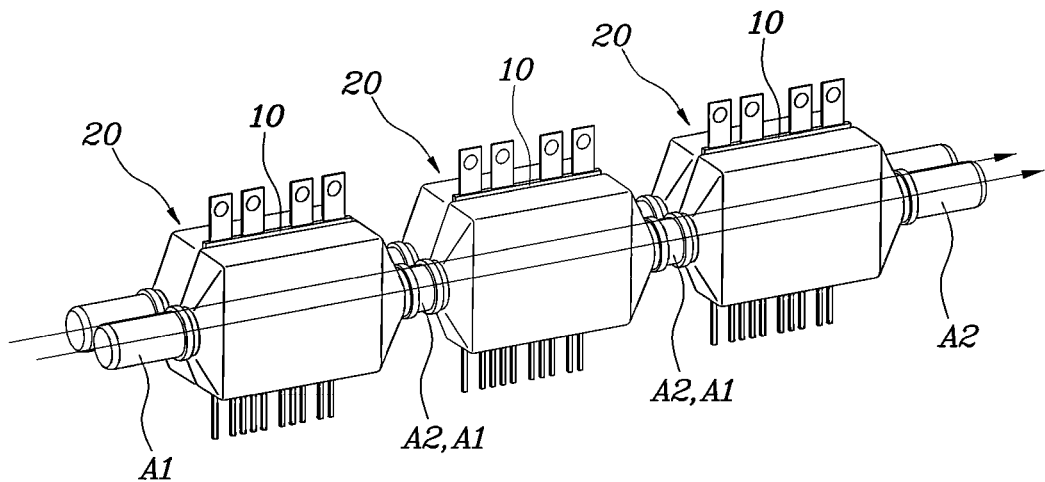
FIG. 8 is a diagram illustrating a cooling apparatus of a power module according to an exemplary embodiment of the present disclosure.
Figure 9:
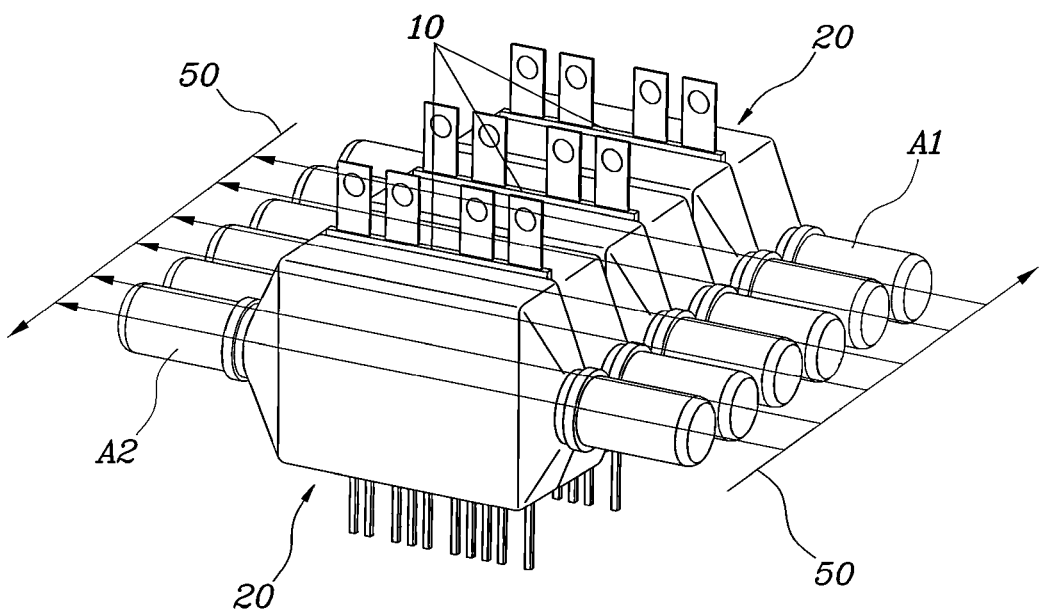
FIG. 9 is a diagram illustrating a cooling apparatus of a power module according to another exemplary embodiment of the present disclosure.

In the present disclosure, FIG. 1 is a diagram illustrating a cooling apparatus of a power module according to an exemplary embodiment of the present disclosure, FIG. 2 is a diagram illustrating a guide of the cooling apparatus of a power module shown in FIG. 1, FIG. 3 is a diagram illustrating a first channel and a second channel of the cooling apparatus of a power module shown in FIG. 1, FIG. 4 is a diagram illustrating a flow of a cooling fluid flow in the cooling apparatus of a power module shown in FIG. 1, FIG. 5 is a diagram illustrating a connection between a manifold cover and the guide of the cooling apparatus of a power module shown in FIG. 1, FIG. 6 is a diagram illustrating a thermal analysis simulation result of the cooling apparatus of a power module shown in FIG. 1, FIG. 7 is a diagram illustrating a cooling apparatus of a power module according to an exemplary embodiment of the present disclosure, FIG. 8 is a diagram illustrating a cooling apparatus of a power module according to another exemplary embodiment of the present disclosure, and FIG. 9 is a diagram illustrating a cooling apparatus of a power module according to another exemplary embodiment of the present disclosure.

As shown in FIG. 1, FIG. 2, FIG. 3, FIG. 4, and FIG. 5, the cooling apparatus of a power module according to an exemplary embodiment of the present disclosure includes a manifold cover 20 to which a power module 10 is coupled and in which an inlet 21 and an outlet 22 through which a cooling fluid flows are formed, and a guide 30 which is provided inside the manifold cover 20 to be in contact with the power module 10, in which a plurality of first channels S1 opened toward the inlet 21 and a plurality of second channels S2 opened toward the outlet 22 are formed, and in which a plurality of micro-flow paths 31 for fluidically communicating the first channels S1 with the second channels S2 are formed.

The manifold cover 20 is formed so that the cooling fluid circulates therein, and an inlet 21 through which the cooling fluid is introduced and an outlet 22 through which a cooling fluid heat-exchanged with the power module 10 is discharged are formed in the manifold cover 20. An inlet nipple A1 and an outlet nipple A2 may be mounted on the inlet 21 and the outlet 22 of the manifold cover 20, respectively.

Furthermore, the guide 30 is formed inside the manifold cover 20 of the present disclosure. The guide 30 may be integrally formed inside the manifold cover 20, and the manifold cover 20 may be manufactured to include the guide 30 through injection molding.

Alternatively, the guide 30 may be separately manufactured, coupled to the manifold cover 20, and bonded to a molding portion 11 of the power module 10. In the present way, because the guide 30 of the manifold cover 20 is configured to be directly bonded to the molding portion 11 of the power module 10, the manifold cover 20 and the guide 30 may each be made of a polymer material such as a thermoplastic elastomer (TPE) or the like.

As another applicable example, the guide 30 may be configured by being replaced with a separate pin plate.

Meanwhile, the molding portion 11 made of an epoxy material may be provided in the power module 10, and an edge portion of the manifold cover 20, which is bonded to the power module 10, may be directly bonded to the power module 10.

The guide 30 forms the first channel S1 and the second channel S2 inside the manifold cover 20, and micro-flow paths 31 are formed in any one of portions or all portions in which the manifold cover 20 is in contact with the power module 10 so that the cooling fluid introduced into the first channel S1 through the inlet 21 flows to the second channel S2 through the micro-flow paths 31. According to cooling specifications of the power module 10, the micro-flow paths 31 of the guide 30 may be selectively formed in any one of a portion in contact with the manifold cover 20 or a portion in contact with the power module 10 or formed in all portions in contact with the power module 10.

That is, the cooling fluid introduced through the inlet 21 of the manifold cover 20 is distributed into a plurality of first channels S1, and the first channel S1 is formed so that an outlet is blocked so that the cooling fluid flows to the second channel S2 through the micro-flow paths 31, flows from the second channel S2 to the outlet 22, and is discharged through the outlet 22. Therefore, according to an exemplary embodiment of the present disclosure, an impingement jet cooling structure is formed due to a fluid flow so that cooling performance of the power module 10 is improved.

Here, impingement jet cooling is a cooling method configured for obtaining a high local heat transfer effect by directly spraying cooled air on a high-temperature wall to remove heat. To actively implement an effect of the impingement jet cooling method, it is necessary to use a turbulent flow rather than a laminar flow. Here, turbulence means a flow with a velocity component in a vertical direction with respect to a flow direction, that is, a flow that is irregular and diffusive with three-dimensional (3D) vorticities of vertical and lateral positions not in the flow direction. When turbulence occurs around an object, a cooling area and cooling fluid mixing become larger, and thus cooling efficiency may be increased.

A detailed description of the impingement jet cooling is as follows. FIG. 6 is a diagram illustrating micro-channels of the cooling device for a power module shown according to an exemplary embodiment of the present disclosure. As shown in FIG. 6, the cooling fluid is introduced from the inlet to form an inlet plenum which is the sum of narrow streams of water. The manifold cover 20 is guided based on the guide 30 to allow the cooling fluid flowing into the first channel S1 or the second channel S2 to be discharged by passing through the plurality of micro-flow paths 31, forming micro-channels. That is, a direction in which the micro-flow paths 31 are formed intersects a direction of the wall of guide 30, and the cooling fluid flowing into the first channel S1 is blocked at the outlet and flows into the second channel S2 through the micro-flow paths 31 so that turbulence is formed. Furthermore, the inlet of the second channel S2 is blocked so that the cooling fluid flows to outlet to pass through the micro-flow paths 31. Accordingly, the cooling fluid in the second channel S2 with increased irregularity and diffusivity results in a higher impingement jet cooling effect.

The above-described impingement jet cooling effect may be seen through a thermal analysis simulation result shown in FIG. 7.

FIG. 7 is a diagram illustrating a thermal analysis simulation result of the cooling apparatus of a power module according to an exemplary embodiment of the present disclosure. The cooling fluid passing from the first channel S1 to the second channel S2 forms vortices based on a recirculation zone to generate various shock waves such as an oscillating shock, a mixing and boundary layer noise, and broad band shock noise. Accordingly, even a cooling fluid layer not being cooled in impingement jet cooling of the conventional laminar flow is recirculated to participate in cooling so that cooling efficiency is improved.

According to the above-described an exemplary embodiment of the present disclosure, the manifold cover 20 is disposed on one side or both sides of the power module 10 so that an arrangement of the manifold cover 20 may be designed according to cooling performance required by the power module 10.

Furthermore, as shown in FIG. 5, the guide 30 is integrally formed inside the manifold cover 20, and the manifold cover 20 is coupled to the power module 10 so that the formation of a separate flow path for realizing an impingement jet cooling effect is not required. Furthermore, as an exemplary embodiment of the present disclosure, the manifold cover 20 and the guide 30 may be made of a TPE material. The TPE material includes a material with properties such as a restoring force and shock absorption, high workability, and excellent lightweightness so that airtightness is secured when the manifold cover 20 is bonded to the power module 10.

That is, the TPE material is a high-functional material that has both elasticity of rubber and a thermoplastic characteristic of plastic and has properties such as a restoring force and shock absorption, high workability, and excellent lightweightness so that, when the manifold cover 20 is made of the TPE material, the corresponding characteristics are secured.

Furthermore, because the manifold cover 20 including the guide 30 may be manufactured by bonding and attaching the molding portion 11 of the power module 10, the easiness of manufacture and the degree of freedom of packaging are secured.

Meanwhile, the present disclosure further includes a gasket 40 configured to extend along an edge portion of the power module 10 and located between the manifold cover 20 and the power module 10. The present gasket 40 is located between the manifold cover 20 and the power module 10 to seal therebetween, preventing the cooling fluid from leaking to the outside. The gasket 40 may be formed to match a shape of a molding portion B forming the edge portion of the power module 10.

Meanwhile, the guide 30 according to an exemplary embodiment of the present disclosure may include a plurality of walls 32 configured to extend to partition the first channel S1 from the second channel S2, first blocking portions 33 connected to both walls 32 to block the outlet 22 in the first channel S1, and a second blocking portion 34 connected to both the walls 32 to block the inlet 21 in the second channel S2.

As may be seen from FIG. 2, the cooling fluid introduced through the inlet 21 of the manifold cover 20 flows from the first channel S1 to the second channel S2 to be discharged through the outlet 22. Although the guide 30 according to an exemplary embodiment of the present disclosure has been disclosed so that the walls 32, the first blocking portions 33, and the second blocking portion 34 have been connected in an orthogonal direction, the present disclosure is not limited thereto. Furthermore, although it is illustrated that the micro-flow paths 31 in the guide 30 have been formed in a lower portion in FIG. 2, when the power module 10 is provided on both sides of the manifold cover 20, the micro-flow paths 31 may be formed in an upper portion of the guide 30.

Furthermore, because the plurality of micro-flow paths 31 are formed in the guide 30, pins are formed between the micro-flow paths 31. In FIG. 2, although the micro-flow paths 31 have been spaced apart at equal intervals and formed in a same position and shape of each wall 32, the present disclosure is not limited thereto.

To describe the guide 30 in detail, because the first blocking portions 33 and the second blocking portion 34, which connect the plurality of walls 32, are formed in the guide 30, the first channel S1 and the second channel S2 may be alternately disposed.

That is, in the guide 30, the plurality of walls 32 are spaced from each other, and each wall 32 is connected through the first blocking portion 33 and the second blocking portion 34 to be integrated. The first blocking portion 33 connects the walls 32 which are located on the outlet 22 and are adjacent to each other so that the first channel S1 in which the inlet 21 is opened and the outlet 22 is closed is formed. The second blocking portion 34 connects the walls 32 which are located on the inlet 21 and are adjacent to each other so that the second channel S2 in which the inlet 21 is closed and the outlet 22 is opened is formed.

Because the first blocking portion 33 and the second blocking portion 34 are alternately disposed in each wall 32, the first channel S1 and the second channel S2 are alternately formed in the guide 30, and as the cooling fluid is distributed to the first channel S1 and the second channel S2, it is easy to form an impingement jet cooling structure.

Meanwhile, in the guide 30, the second channel S2 is located to face the inlet 21 of the manifold cover 20 so that the second blocking portion 34 faces the inlet 21, and the first channel S1 and the second channel S2 are alternatively disposed on both sides of the second channel S2 disposed to face the inlet 21.

As shown in FIG. 3, because the guide 30 is disposed so that the second channel S2 formed by the second blocking portion 34 faces the inlet 21, the cooling fluid introduced through the inlet 21 of the manifold cover 20 may be distributed by the second blocking portion 34 to flow into each first channel S1. Accordingly, the inlet 21 of the manifold cover 20 may be disposed in a center portion of the manifold cover 20, and the second channel S2 of the guide 30 may also be disposed in the center portion thereof. Furthermore, because the first channel S1 and the second channel S2 are alternately disposed based on the second channel S2 by the guide 30, an impingement jet cooling structure is formed due to the cooling fluid flowing through the first channel S1 and the second channel S2.

That is, the inlet 21 and the outlet 22 of the manifold cover 20 are disposed on a straight line, the first channel S1 and the second channel S2 extend in a straight line along the inlet 21 and the outlet 22 in the guide 30, and the micro-flow paths 31 are formed to intersect perpendicular to an extension direction of the first channel S1 and the second channel S2.

In the present way, because the first channel S1 and the second channel S2 are formed on the straight line by the guide 30 inside the manifold cover 20 and the cooling fluid passes through the micro-flow paths 31 of the guide 30, the impingement jet cooling effect may be implemented due to a distribution flow of the first channel S1 and the second channel S2.

Furthermore, because the inlet 21 and the outlet 22 are disposed in a straight line, and the first channel S1 and the second channel S2 also extend in a straight line, flowability of the cooling fluid is improved, and the micro-flow paths 31 are formed to intersect at the first channel S1 and the second channel S2 in a vertical direction so that the cooling performance of the power module 10 is improved through the flow of the cooling fluid.

Meanwhile, the micro-flow path 31 of the guide 30 may be formed to have a cross section shape which is a curved shape including a polygonal or semicircular shape. In an exemplary embodiment of the present disclosure, it is disclosed that the micro-flow path 31 is formed in a semicircular shape. The shape of the micro-flow path 31 may be determined according to the flowability of the cooling fluid flowing from the first channel S1 to the second channel S2. According to a shape, a size, and the number of micro-flow paths 31, a flow rate and a flow speed of the cooling fluid flowing from the first channel S1 to the second channel S2 are determined so that the impingement jet cooling effect may be implemented.

Alternatively, the manifold cover 20 is provided as a plurality of manifold covers 20, and the manifold covers 20 are disposed on both side surfaces of the power module 10 so that the power module 10 may exchange heat with the cooling fluid through the plurality of manifold covers 20.

That is, the manifold covers 20 are disposed on both sides of the power module 10, and the cooling fluid flowing into each manifold cover 20 exchanges heat with the power module 10 through the implementation of impingement jet cooling so that the cooling performance of the power module 10 may be improved through cooling of both surfaces. This may be determined according to the cooling specifications required by the power module 10.

The manifold cover 20 according to an exemplary embodiment of the present disclosure may be provided as a plurality manifold covers 20, being applied in various examples.

As shown in FIG. 8, the manifold cover 20 is provided as a plurality of manifold covers 20, and when each manifold cover 20 is disposed in series, the inlet 21 and the outlet 22 of each manifold cover 20 are connected to those of another manifold cover 20 so that the cooling fluid may be shared.

In the present way, when the plurality of manifold covers 20 are disposed in series, the cooling fluid may sequentially pass through the manifold covers 20 to perform cooling of the power module 10. In the instant case, because the inlet 21 and the outlet 22 of each manifold cover 20 are connected to those of another manifold cover 20 to share the cooling fluid, an impingement jet cooling effect is implemented through the guide 30 inside each manifold cover 20 so that the cooling of the power module 10 is performed. Here, when different manifold covers 20 are connected, a passage may be formed by integrating inlets 21 and outlets 22.

Figure 10:
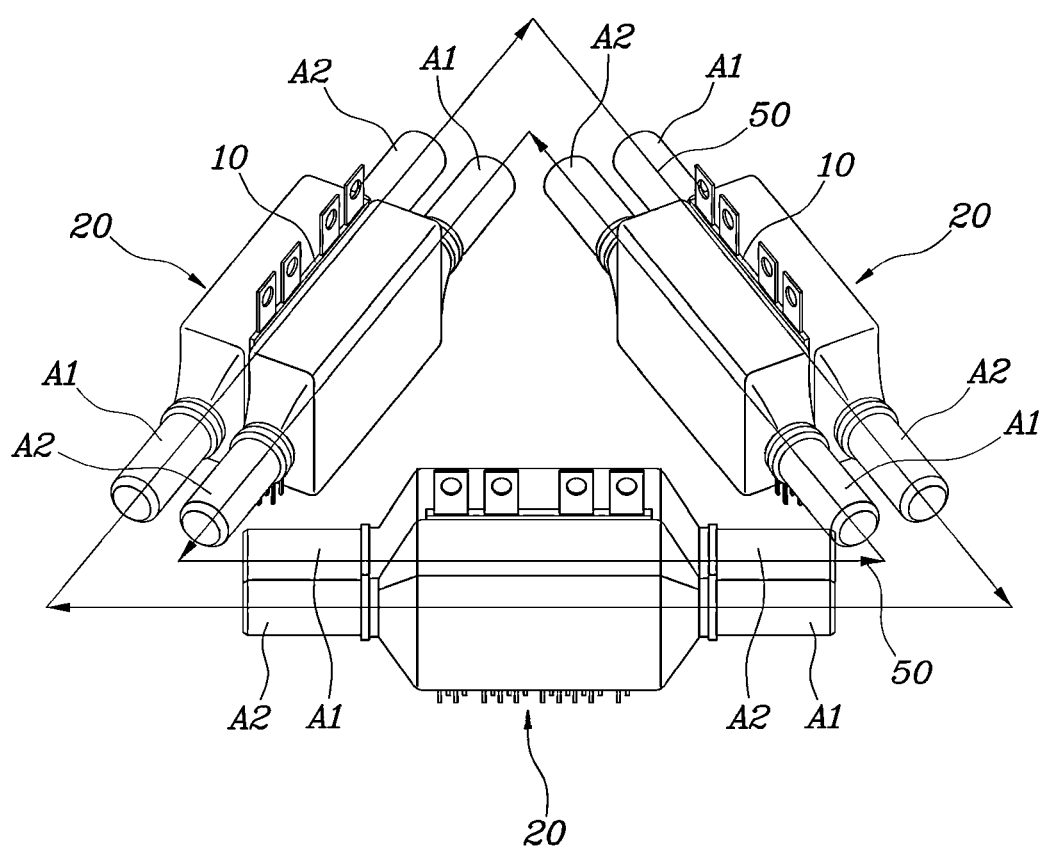
FIG. 10 is a diagram illustrating a cooling apparatus of a power module according to yet another exemplary embodiment of the present disclosure.

Alternatively, as shown in FIG. 9 and FIG. 10, the manifold cover 20 is provided as a plurality of manifold covers 20, and when each manifold cover 20 is disposed in parallel, the inlet 21 and the outlet 22 of each manifold cover 20 are connected to those of another manifold cover 20 through a connection passage 50 so that the cooling fluid may be shared.

In the present way, when each manifold cover 20 is disposed in parallel, the cooling fluid is shared by connecting the inlets 21 and the outlets 22 of the manifold covers 20 through the connection passage 50. Here, the parallel arrangement of the manifold covers 20 may include various arrangement forms including a polygonal arrangement, a circular arrangement, and the like, and the cooling fluid is shared through the connection passage 50.

In the present way, the manifold cover 20 is provided the plurality of manifold covers 20, and an arrangement structure of each manifold cover 20 may be determined according to a design space and a cooling capacity of the power module 10 to be applied in various ways.

The cooling apparatus of a power module including the structure as described above is configured so that the guide is provided inside the manifold cover to control a flow of the cooling fluid, and the cooling fluid circulated inside the manifold cover forms a vertical turbulent flow by the guide so that cooling efficiency of the power module is secured only using an internal structure of the manifold cover. Thus, the present disclosure improves the heat dissipation performance without a separate fin plate or a separate nozzle injection device.

A cooling apparatus of a power module having the structure as described above is configured so that a guide is provided inside a manifold cover to control a flow of a cooling fluid, and the cooling fluid circulated inside the manifold cover forms a vertical turbulent flow by the guide so that cooling efficiency of the power module is secured only using an internal structure of the manifold cover. Thus, the present disclosure improves the heat dissipation performance without a separate fin plate or a separate nozzle injection device.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the present disclosure and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A cooling apparatus of a power module, the cooling apparatus comprising: a manifold cover to which the power module is coupled and in which an inlet and an outlet through which a cooling fluid flows are formed; a guide which is provided inside the manifold cover to be in contact with the power module, wherein guide includes: a plurality of first channels opened toward the inlet of the manifold cover; a plurality of second channels opened toward the outlet of the manifold cover,
   and a plurality of third channels fluidically communicating the first channels with the second channels;
   wherein the guide includes: a plurality of walls extending to partition the first channels and the second channels in the guide; first blocking portions connected to two walls among the plurality of walls to block the outlet in the first channels; and a second blocking portion connected to two walls among the plurality of the walls to block the inlet in the second channels.

2. The cooling apparatus 1, wherein a cross-sectional area of the plurality of third channels is smaller than a cross-sectional area of the plurality of first channels and a cross-sectional area of the plurality of second channels.

3. The cooling apparatus 1, further including a gasket located between the manifold cover and the power module.

4. The cooling apparatus 1, wherein, in the guide, the first blocking portion and the second blocking portion which connect the plurality of walls are formed so that the first channels and the second channels are alternately disposed in the guide.

5. The cooling apparatus 1, wherein, in the guide, the second channels are located to face the inlet of the manifold cover so that the second blocking portion faces the inlet, and the first channels and the second channels are alternately disposed on first and second sides of the second channels disposed to face the inlet.

6. The cooling apparatus 1,
   wherein the inlet and the outlet of the manifold cover are disposed on a straight line, and
   wherein the guide is formed so that the first channels and the second channels extend in a straight line along the inlet and the outlet, and the third channels intersect perpendicular to an extension direction of the first channels and the second channels.

7. The cooling apparatus 1, wherein the third channels of the guide are formed to have a cross section of a curved shape including a polygonal or semicircular shape.

8. The cooling apparatus 1, wherein the manifold cover and the guide are each made of a thermoplastic elastomer (TPE) material.

9. The cooling apparatus 1,
   wherein a molding portion made of an epoxy material is provided in the power module, and
   wherein an edge portion of the manifold cover, which is adhered to the power module, is directly adhered to the power module.

10. The cooling apparatus 1, wherein the manifold cover is manufactured to include the guide through injection molding, and the manifold cover is bonded and adhered to the molding portion of the power module.

11. The cooling apparatus 1, wherein the manifold cover is provided as a plurality of manifold covers, and the manifold covers are disposed on first and second sides of the power module so that the power module exchanges heat with the cooling fluid through the plurality of manifold covers.

12. The cooling apparatus 1, wherein, when the manifold cover is provided as a plurality of manifold covers and each manifold cover is disposed in series, an inlet and an outlet of each manifold cover are connected to an inlet and an outlet of another manifold cover so that the cooling fluid is shared therebetween.

13. The cooling apparatus 1, wherein, when the manifold cover is provided as a plurality of manifold covers and each manifold cover is disposed in parallel, an inlet and an outlet of each manifold cover are connected to an inlet and an outlet of another manifold cover through a connection passage so that the cooling fluid is shared therebetween.

* * * * *